United States Patent [19]

Tsujimoto et al.

[11] Patent Number: 6,012,413
[45] Date of Patent: Jan. 11, 2000

[54] ELECTRON BEAM SOURCE FOR USE WITH VARYING SIZES OF CRUCIBLES

[75] Inventors: Nick Tsujimoto, Moraga; Peter H. Harris, San Francisco; Wei Gao, Fremont, all of Calif.

[73] Assignee: MDC Vacuum Products Corp., Hayward, Calif.

[21] Appl. No.: 09/041,055

[22] Filed: Mar. 10, 1998

[51] Int. Cl.⁷ .................................................. C23C 16/00
[52] U.S. Cl. ...................................... 118/723 EB; 118/726
[58] Field of Search ............................... 118/723 EB, 726, 118/715

*Primary Examiner*—R. Bruce Breneman
*Assistant Examiner*—Erin Fieler
*Attorney, Agent, or Firm*—James E. Eakin

[57] ABSTRACT

An electron beam source provides beam focusing by placing magnets under the crucible. The location of the magnets, operating in conjunction with the remaining magnetic and electromagnetic structure, permits varying sizes of crucibles to be used without redesign of the remainder of the electron beam source.

1 Claim, 3 Drawing Sheets

ELECTRON BEAM SOURCE FOR USE WITH VARYING SIZES OF CRUCIBLES

FIELD OF THE INVENTION

This application relates to electron beam source assemblies, and more particularly relates to electron beam source assemblies capable of working with different sizes of crucibles.

BACKGROUND OF THE INVENTION

Electron beam source assemblies for use in high pressure differential/vacuum environments are known in the prior art. Such assemblies generally include a thermionic emitter mechanism to generate and accelerate an electron beam which is deflected by a magnetic field into a crucible structure containing one or more materials. The material or materials are vaporized by the electron beam and deposited on the desired substrate. The vaporized material(s) is deposited on a desired substrate in, for example, the field of thin film deposition. One particular application is optical coatings. One such electron beam source assembly is disclosed in U.S. Pat. No. 3,883,679 to Shrader et al.; another is shown is U.S. Pat. No. 5,418,348, assigned to the assignee of the present invention.

The electron beam source assemblies described above, including the Shrader device, typically form the water cooled crucible in a metallic block, place the emitter mechanism at a distance from the crucible to prevent damage to the emitter, and position permanent or electromagnets to generate a transverse magnetic field to deflect the electron beam and focus it onto the crucible.

The transverse magnetic field used to deflect the electron beam is typically generated between and perpendicular to parallel pole pieces extending from a single magnet, or between spaced, parallel magnets. The transverse magnetic field generally includes substantially uniform field lines between the magnetic pieces, plano-convex field lines above and at the ends of the magnetic pieces, and convex field lines above the plano-convex field lines.

The magnetic structure employed in typical electron gun assemblies generates field lines at the emission site of the electron gun assembly to contain the emitted beam within the assembly and prevent loss or dissipation of the beam therefrom. The beam is typically injected from the emitter into the crucible in the metallic block. Electron beam source assemblies generally are formed integrally with the crucible structure; that is, the crucible is maintained in a fixed position and size relative to the emitter. In some instances, a plurality of crucibles are installed on a rotary table and the crucible containing the material of interest for that step is rotated into position relative to the electron beam source. However, each of these crucibles is typically of the same or at least nearly the same size and, when rotated into position, is the same size and position relative to the emitter as the other crucibles in the turntable.

To vary the size of the crucible has, in the past, required that the entire assembly be redesigned. This limits design flexibility and increases costs for the manufacturer and the user, and increases spare parts costs significantly. However, the arrangement of magnets or electromagnets on either side of the crucible have, in the prior art, made it extremely difficult if not impossible to alter the size of the crucible associated with any given emitter. Conventional designs have limited the industry to what are generally specialized devices for each application.

As a result, there has been a long-felt need in the industry for an electron beam assembly which may be installed with various sizes of crucibles without significant redesign.

SUMMARY OF THE INVENTION

The present invention overcomes the limitations of the prior art and provides an electron beam source design which is formed separately from, may be readily adapted to fit a range of sizes of, a crucible.

One important element of a presently-preferred embodiment of the present invention is the location of a magnetic structure under the space for the crucible, rather than alongside the crucible. In an exemplary embodiment, the magnetic structure typically comprises a pair of parallel permanent magnets spaced apart to provide north and south polarities. The two permanent magnets rest on a magnetic steel plate, and together form a magnetic field structure. The structure slides underneath the crucible, which permits the magnetic field generated by the magnetic field structure to be strongest at the most critical area of the crucible.

By placing the strongest point of the magnetic field directly beneath the crucible, the size of the crucible may be varied over a relatively wide range without changing the magnetic structure.

These and other objects of the present invention may be better appreciated by the following Detailed Description of the Invention, taken together with the attached Figures.

FIGURES

DETAILED DESCRIPTION OF THE INVENTION

Figure 1:
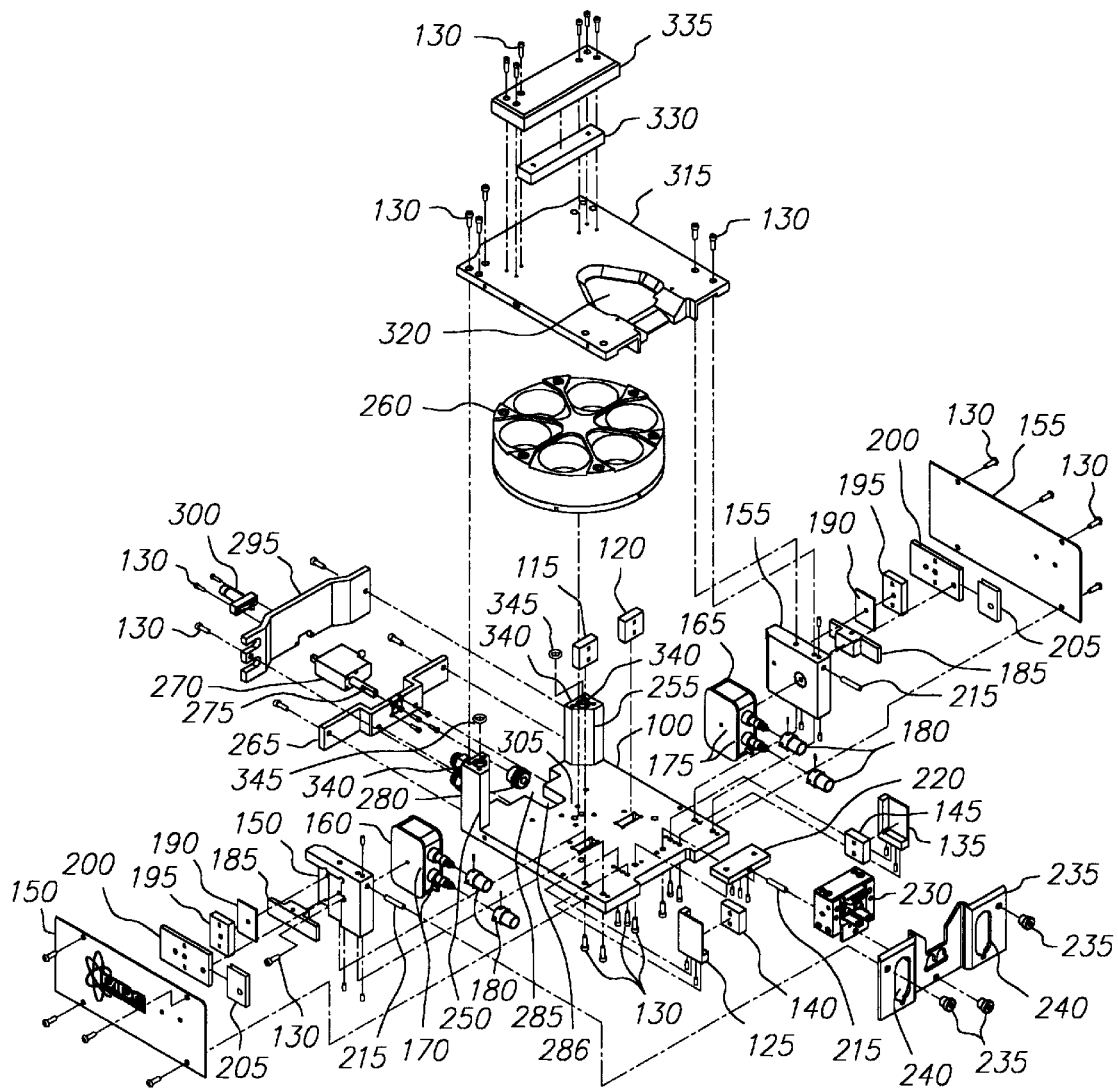
FIG. 1 shows in exploded isometric view of one embodiment of the electron beam source of the present invention.

Referring now to FIG. 1, the electron beam source of the present invention may be better appreciated. A ferrous base plate weldment 100 includes a pair of receptacles 105 and 110. A pair of magnets 115 and 120, are disposed within the receptacles 105 and 110. The first magnet 115 is oriented with the south pole up and the north pole down, while the second magnet 120 is oriented with opposite polarity. The left magnet 115 is typically oriented with the south pole up and the right magnet 120 is typically oriented with the north pole up.

A left hand front magnet support 125 is mounted to the weldment 100 by means of a pair of screws 130 as shown by the dotted lines extending therebetween. Similarly, a right hand front magnet support 135 is. mounted to the weldment 100 by means of a second pair of screws 130. A second pair of magnets 140 and 145, again one oriented with the north pole up and the other oriented with the south pole up, are oriented within the supports 125 and 135, respectively. As will be appreciated by those skilled in the art, the polarities of the magnets remain consistent for each side of the A left hand cooling plate 150 is mounted to the weldment 100, again by a pair of screws 130, at the points shown by the associated dotted lines. Symmetrically, a right hand cooling plate 155 is mounted to the weldment 100 by a pair of screws 130, also as shown by the associated dotted lines. Mounted to the inside surfaces of the cooling plates 150 and 155 are left and right hand coil housing weldments and assemblies 160 and 165, respectively. The coil housing weldments 160 and 165 may be mounted to the plates 150 and 155 through any suitable means, including screws 130. Each of the left and right hand coil housing weldments typically includes a pair of coils 170 and 175. Each of the pairs of coils 170 and 175 are typically protected from the heated environment by coil insulator covers 180.

Affixed to the respective outside surfaces of each the plates 150 and 155 are side magnet support bars 185. External to the respective support bars 185 are magnet shunts 190 which fit into stepped recesses in the cooling plates, and external to the magnet shunts are left and right front modifying magnets 195 and left and right side magnet poles 200. A magnet sheath 205 may be affixed to each of the magnets 200. It will be noted that the polarity of the magnets 195 and 200 for the left and right hand sides will be the same as the associated magnets 115 and 120. Outboard of both magnets 200 are left and right side covers 210, which may be affixed to the remainder of the assembly by means of screws 130 which mount into the sides of the weldment 100 along the dotted lines shown. Studs 215 are typically threaded into the front vertical surfaces of the cooling plates 150 and 155.

Affixed to the front of the weldment 100 is an emitter support bar 220, which may be attached to the weldment by means of screws 130. A stud 215 is threaded into the front of the support bar 220, and extends through emitter assembly 230. A nut 235 is used to affix the emitter assembly onto the stud, which permits the emitter assembly 230 to be rigidly juxtaposed against the front edge of the support bar 220 and the front edge of the weldment 100. The emitter assembly may be constructed in a conventional manner, such as that described in U.S. Pat. No. 5,418,348, the relevant portions of which are incorporated herein by reference.

Mounted in front of the emitter assembly 230 is an emitter cover 235, which is affixed to the front edges of the cooling plates 150 and 155 by means of nuts 235 affixed to studs 215. The emitter cover 235 includes ports 240 through which the pairs of coils 170 and 175 may be accessed for connection of the electrical potential needed for operation of the electron beam source.

Affixed to the left rear and right rear corners of the weldment 100 are posts 250 and 255, which in an exemplary embodiment typically have beveled inner edges to provide clearance for rotation of a crucible turntable 260. A gear drive plate 265 may be mounted to the rear surface of the weldment 100 by means of screws 130, with a miter gear box assembly 270 mounted to the drive plate 265 by means of additional screws 130. A shaft 275 of the gear box assembly 270 extends through the plate 265 and extends into a gear 280, which fits into a first cut-out portion 285 of the weldment 100. The plate 265 can be seen to be formed with an inset portion, which mates to a second cut-out portion 290 of the weldment 100. An indexer plunger mount 295 mounts to the posts 250 and 255 and sandwiches the miter gear box between the gear drive plate and the plunger mount 295.

A crucible turntable 260 may be mounted rotatably into the open space above the weldment 100 defined by the coil housing weldments 160 and 165, emitter assembly 230 and gear drive plate 265. The turntable 260 mounts to the weldment 100 through holes 305 and includes a toothed track which coacts with gear 280 to cause the turntable 260 to rotate when the miter gear box assembly is actuated through the rear indexer plunger 300. The turntable 260 may include a plurality of crucibles 310, which may for example be on the order of six crucibles each of approximately 40 cc capacity.

A six crucible top cover 315 is, in an exemplary embodiment, mounted to the tops of posts 250 and 255, and also to left and right cooling plates 150 and 155. The cover 315 is typically mounted through the use of screws 130. An opening 320 exposes the crucible 310 of interest to the beam generated by the emitter assembly. A large bar magnet 330 is positioned near the rear surface of the cover plate 315 and orthogonally to the coil assemblies 160 and 165. The polarity of the magnet 330 is arranged to be consistent with the polarities of the magnets 115 and 120. A top plate magnet holder 335 fastens the magnet 330 to the top cover 315, typically by screws 130. Coolant can be provided to the crucible through passages 340 extending vertically through the posts 250 and 255, with seals against cover plate 315 by means of O-rings 345.

The electron beam emitted by the emitter assembly 230 can be understood by those skilled in the art to extend over the emitter assembly 230 and into the crucible 310. The beam is steered by magnets 140 and 145 and by electromagnets coil weldments and assemblies 160 and 165 together with permanent magnets 195 and 200. The beam is focused into the crucible 310 by magnets 115 and 120, which can be seen to be positioned below the crucible in a new and novel arrangement. Importantly, it can be appreciated that the emitter assembly, weldment and electromagnet assemblies need not be redesigned for each different size of crucible required by a customer's application. Instead, the crucible size may be varied over a wide range of sizes without altering the remainder of the electron beam source. Moreover, in the event the application calls for a very large crucible, beyond the mechanical range of the existing configuration, this design can be accommodated simply by moving the magnetic structure and posts 250 and 255 outward underneath the crucible and increasing the energy level of the electron beam to permit it to travel to the desired location (typically near the center) of the large crucible. In this manner, crucibles of several feet in diameter may be accommodated. Thus, the present invention provides a unique and novel arrangement.

Figure 2:
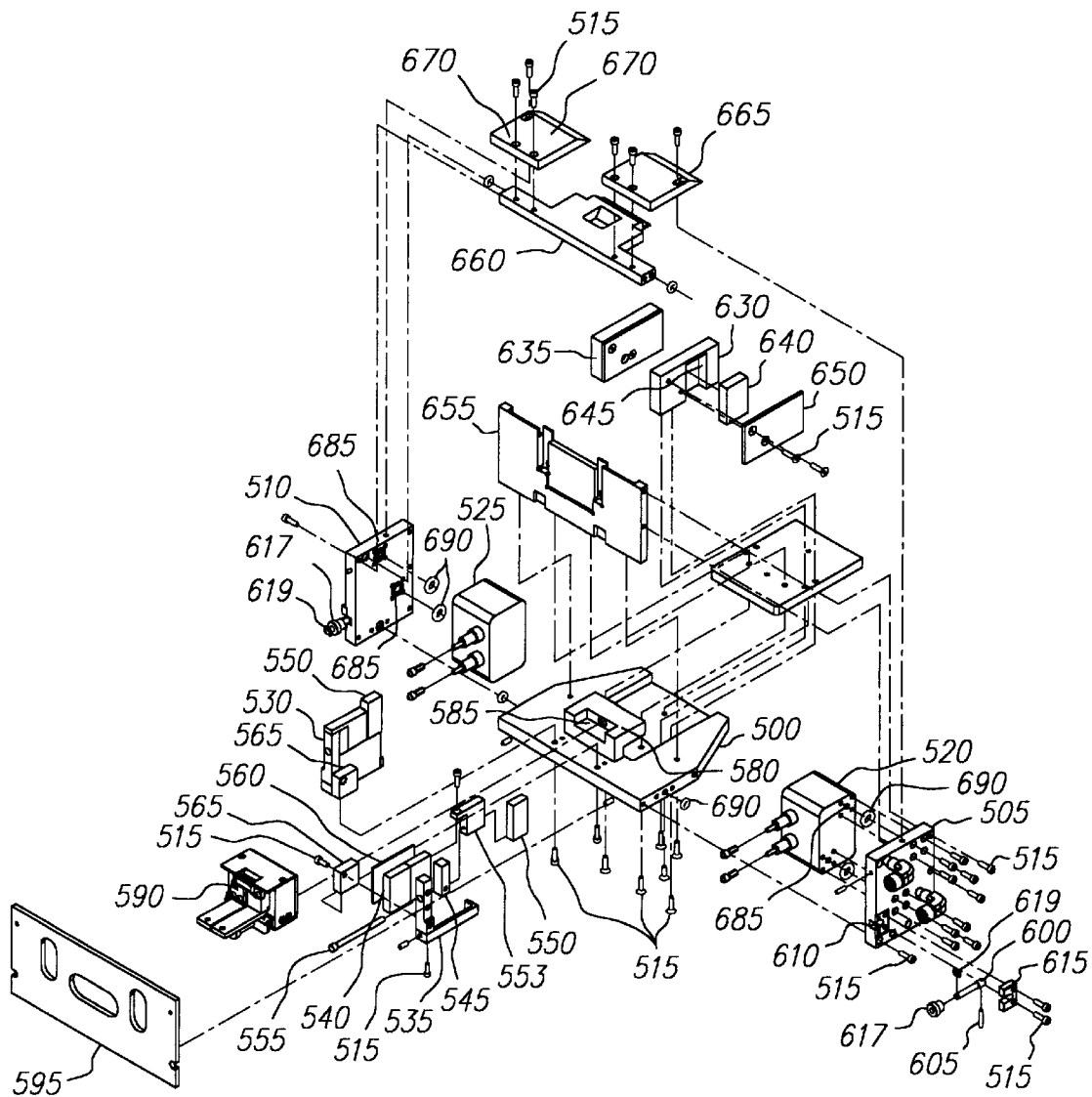
FIG. 2 shows in exploded isometric view a second embodiment of the electron beam source of the present invention.

Referring next to FIG. 2, an alternative and presently preferred embodiment is shown in exploded isometric view. While the magnetic structure of the device of FIG. 2 operates in a virtually identical way to the device of FIG. 1, the structure of FIG. 2 is more flexible in allowing varying sizes of crucibles and in fact may be provided as a standalone electron beam source with the customer to provide one of more crucibles of the customer's choosing. This permits the customer to use a linear crucible of nearly any dimension, or a circular or other shape of crucible. The key structural differences between the device of FIG. 1 and the device of FIG. 2 involves primarily the removal of the posts 250 and 255 (FIG. 1.)

Still with reference to FIG. 2, an emitter base plate brazement 500 has mounted to its right and left sides, respectively, right and left side plate brazement 505 and 510. The right and left side plate brazements may be mounted in any conventional manner, for example by screws 515. Affixed to the respective inner side surfaces of the side plate brazements 505 and 510 are coil assemblies 520 and 525. For both the right and left sides of the source a magnetic structure is formed beginning with a top magnet support bracket 530 which is affixed by a screw 515 to a bottom magnet support bracket 535. A magnet 540 fits into each assembly of the bracket 530 and 535, and a first magnet structure bar 545 fits atop the magnet 540. A second, somewhat L-shaped magnet structure bar 553 fits across the top of the magnet 540 and also across the top of the first magnet structure bar 545, and extends onward over the top of the top magnet support bracket 530 to which it is affixed by a screw 515. Both left and right sides also include a magnet support bar 550. A longer screw 555 extends through the top magnet support bracket, the first and second magnet structure bars and the magnet support bar to fix the pieces together. A carousel source magnet shunt 560 is juxtaposed against the inner surface of the magnet 540, and a magnet brace 565 is affixed to the shunt 560 and magnet 540 by virtue of a screw 515 which extends through the brace, shunt and magnet into the top magnet support bracket 530. Both the right and left magnetic structures, which may be referred to generally as 570 and 575, respectively, mount to the top of the emitter base plate brazement 500 FIG. 2 he dotted lines shown in FIG. 2 by virtue of screws 515 which extend through the base plate and into the bottom of the magnet braces 565. It can thus be seen that the magnet structures 570 and 575 extend along either side of a pedestal 580 which is shown as part of the brazement 500 and includes a recessed portion 585. An emitter assembly 590 of the type described in U.S. Pat. No. 5,418,348 fits into the recess 585. A front plate 595 is affixed to the front of brazement 500 and is also mounted in place by virtue of swivel screws 600 which have pins 605 extending therethrough. The screws 600 fit into a recess 610 in the right and left side plate brazements 505 and 510 and are locked into place by covers 615 and screws 515. Nuts 617 and R-rings 619 retain the swivel screws and associated elements in place.

A magnetic return bar 620 fits into an opening 625 in the brazement 500. Mounted onto the magnetic return bar 620 are right and left magnet platforms 630 and 635. Magnets 640 fit into recesses 645 in the platforms, and are held in place laterally by magnet side supports 650 and screws 515 extending laterally therethrough. The magnet platforms 630 and 635 are affixed to the magnet return bar by screws 515 extending upward from underneath the return bar 620. It will be appreciated that the magnet platforms extend until they are magnetically proximate to a back plate 655 which extends laterally across the brazement 500 in front of the pedestal 580. A top plate 660 fastens to the top of the left and right side plate brazements 505 and 510. Right and left coil covers 665 and 670 fasten by means of screws 515 on either side of the top plate and cooperate with a tongue portion 675 thereof to form a top cover for the emitter assembly. Coolant may be introduced into the coil assemblies and brazement 500 by means of passageways 685 through the side plate brazements, coil assemblies and base plate brazement, which are typically sealed by O-rings 690.

Figure 3:
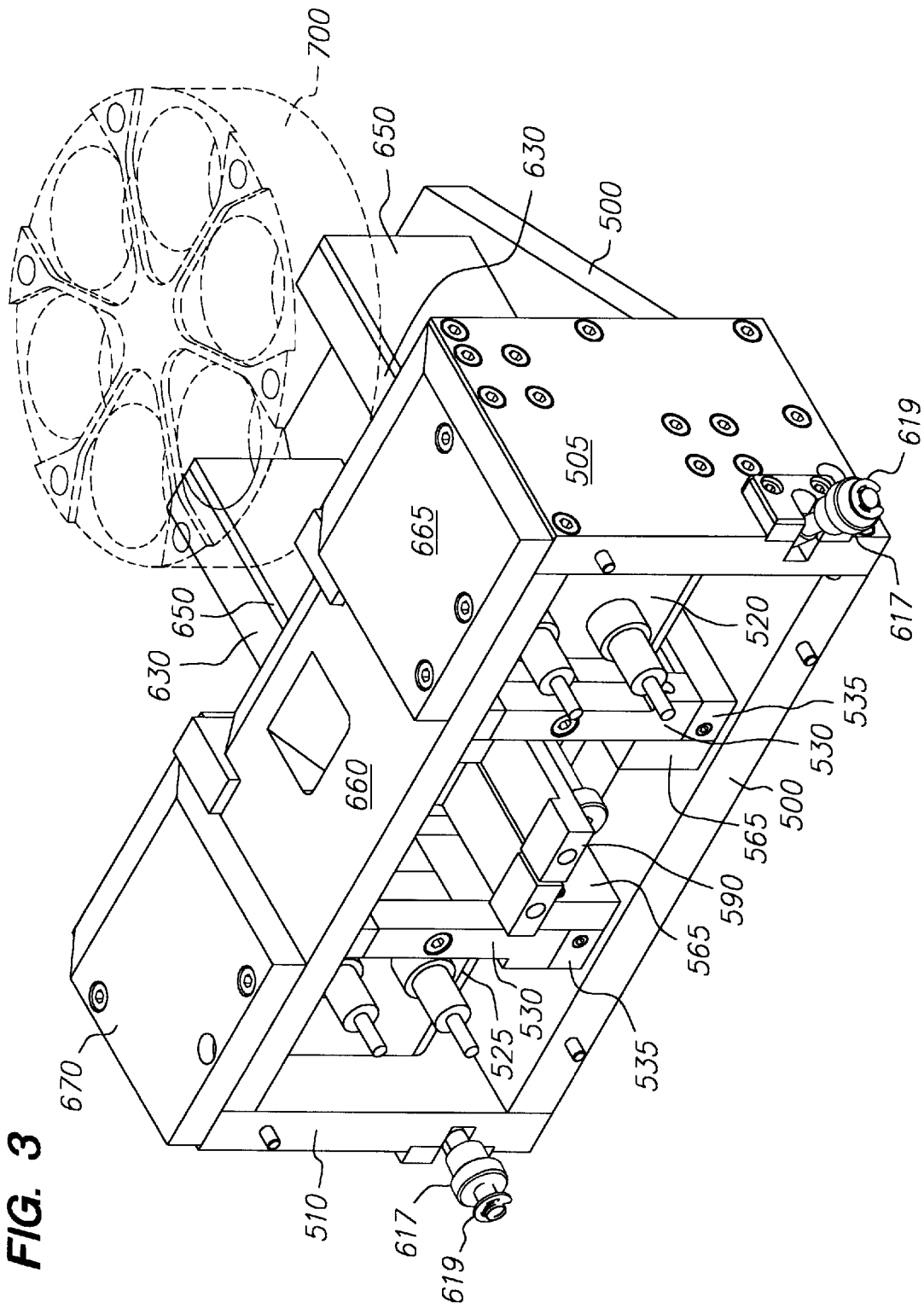
FIG. 3 shows in assembly view the electron beam source of FIG. 2.

The emitter assembly can be best appreciated in its entirety from FIG. 3, which shows in phantom an exemplary carousel assembly 700 which may be provided by, for example, the customer or the supplier of the electron beam source is so desired by the customer. However, a key advantage of the present design is that no element of the electron beam source extends above the bottom of the crucible, so that any of a very wide variety of sizes and shapes of crucibles may be supplied for use with a single design of electron source. This provides a heretofore unknown level of flexibility as well as reducing costs. As with the design of FIG. 1, but in fact with greater facility, the structure of FIGS. 2 and 3 may be elongated along the path of the electron beam to permit use of crucibles extending even to several feet. It will be appreciated that in both embodiments discussed herein, the location of the magnetic structure for focusing the electron beam underneath the crucible permits maintaining a tightly focused beam while at the same time permitting exceptional flexibility.

Having fully described a preferred embodiment of the invention and various alternatives, those skilled in the art will recognize, given the teachings herein, that numerous alternatives and equivalents exist which do not depart from the invention. It is therefore intended that the invention not be limited by the foregoing description, but only by the appended claims.

What is claimed is:

1. An electron beam source comprising a base plate arranged to be positioned under a crucible, an emitter assembly adapted to emit a stream of high energy electrons, a plurality of magnets for steering the stream of high energy electrons toward the crucible, and a pair of magnets positioned on the base plate under the crucible for focusing the beam of high energy electrons into the crucible, a first one of the pair arranged to have a first polarity at the upper edge thereof and the second one of the pair arranged to have the opposite polarity at the upper edge thereof.

* * * * *